United States Patent
Uzoh et al.

(10) Patent No.: US 6,251,528 B1
(45) Date of Patent: *Jun. 26, 2001

(54) METHOD TO PLATE C4 TO COPPER STUD

(75) Inventors: Cyprian Emeka Uzoh, Hopewell Junction; Daniel C. Edelstein, New Rochelle, both of NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/004,808

(22) Filed: Jan. 9, 1998

(51) Int. Cl.$^7$ ................ B32B 17/06; B32B 9/00
(52) U.S. Cl. ............................. 428/587; 428/596
(58) Field of Search ..................... 205/149, 159; 428/587–596

(56) References Cited

U.S. PATENT DOCUMENTS

| | | |
|---|---|---|
| 4,840,302 | 6/1989 | Gardner et al. . |
| 5,010,389 | 4/1991 | Gansauge et al. . |
| 5,089,440 | 2/1992 | Christie et al. . |
| 5,244,833 * | 9/1993 | Gansauge ............... 437/183 |
| 5,256,274 * | 10/1993 | Poris ...................... 205/123 |
| 5,298,459 | 3/1994 | Arikawa et al. . |
| 5,316,974 * | 5/1994 | Crank ...................... 437/190 |
| 5,384,283 | 1/1995 | Gegenwarth et al. . |
| 5,462,638 | 10/1995 | Datta et al. . |
| 5,486,282 | 1/1996 | Datta et al. . |
| 5,492,235 | 2/1996 | Crafts et al. . |
| 5,503,286 | 4/1996 | Nye, III et al. . |
| 5,543,032 | 8/1996 | Datta et al. . |
| 5,591,480 | 1/1997 | Weismann et al. . |
| 5,834,827 * | 11/1998 | Miyasaka ............... 257/578 |
| 5,872,696 * | 2/1999 | Peters .................... 361/305 |
| 5,891,802 * | 4/1999 | Tao ........................ 438/656 |

FOREIGN PATENT DOCUMENTS

| | | |
|---|---|---|
| 52-155055 | 6/1976 | (JP) . |
| 3-190240A | 8/1991 | (JP) . |

* cited by examiner

Primary Examiner—Kathryn Gorgos
Assistant Examiner—J. Maisano
(74) Attorney, Agent, or Firm—Connolly Bove Lodge & Hutz LLP

(57) ABSTRACT

A method for plating a second metal directly to a first metal without utilizing a mask. A semiconductor substrate is provided including at least one metal feature and at least one insulating layer covering the metal feature and the substrate. At least one recess is formed in the at least one insulating layer thereby exposing at least a portion of the metal feature. At least one conductive barrier layer is formed over the insulating layer and the exposed portion of the metal feature. A plating seed layer of a first metal is formed over the at least one barrier layer. A photoresist layer is deposited over the plating seed layer. Portions of the photoresist layer and of the plating seed layer outside of the at least one recess are removed. Photoresist remaining in the at least one recess is removed. A second metal is electroplated to the plating seed layer in the recess.

14 Claims, 2 Drawing Sheets

METHOD TO PLATE C4 TO COPPER STUD

TECHNICAL FIELD

The present invention relates to a process for plating a conductive material to a conductive feature in and/or on a substrate. More particularly, the present invention concerns electroplating a conductive material to a metal feature in and/or on a substrate using a highly conducting barrier film to conduct electrical current. In particular, the present invention provides methods for electroplating a solder ball utilized in a controlled collapse chip connection (C4) process to a metal feature provided in and/or on a substrate. Additionally, the present invention provides semiconductor structures prepared according to processes of the present invention.

BACKGROUND OF THE INVENTION

Various techniques have been investigated and utilized for attaching conductive material to semiconductor chips. These methods include the lift-off process, thru-mask methods, metal reactive ion etch (RIE) and metal and insulator damascene and various combinations of the above-listed methods. The lift-off and thru-mask methods are more valuable for large features, such as those typically encountered in chip packaging. Unlike the lift-off process and the thru-mask methods, the metal RIE and insulator damascene methods have been the process of choice for chip metallizations where the ground rules are typically below one micron.

In accordance with the damascene process, metal film may be deposited over the entire patterned substrate surfaces to fill trenches and vias. This metal deposition may then be followed by metal planarization to remove metal overburden and to isolate and define the wiring pattern. When metal deposition is by electroplating or by electroless plating processes, the plating may be preceded by the deposition of a plating base or seed layer over the entire surface of the patterned wafer or substrate. Also, layers that may improve adhesion, and/or prevent conductor-insulator interactions and/or interdiffusion may be deposited between the plating base or seed layer and the insulator.

In the metal RIE methods, blanket metal film is etched to define the conductor pattern. The gaps between the metal lines and vias are then filled with insulators. In high performance applications, the dielectric is planarized to define a flat metal level. One of the main advantages of the damascene process as compared to metal RIE is that it is often easier to etch an insulator as opposed to metal. Also, insulator gap fill and planarization may be more problematic.

In the metal damascene process, all the recesses in the insulator are first filled with metal before metal polishing. However, during the metal deposition into trenches and vias, all the narrower features become filled before their wider counterparts. Thus, all features with width less than 2 microns will be filled before those with width greater than 5 microns. Hence, to fill trenches or test pads with width of 50 microns, the smaller recesses typically with widths less than 5 microns are overplated. During metal chemical-mechanical polishing (CMP), the additional time needed to remove the excess metal overburden on the overplated smaller features causes dishing on the larger features. Also, because of the prolonged polishing times, insulator adjacent may severely erode. Severe dishing and insulator erosion in large metal features is a source of yield loss, especially when the occur at lower levels. Here they cause trapped metal defects at the next higher level. The longer time needed to remove the thicker metal overburden of the smallest metal lines and vias is one of the main culprits responsible for the low thruput and yield losses in the metal CMP process.

Moreover, this last metal wiring level, which may include Cu, Al, Au, Ni, W, α-Ta, and/or other metals and/or alloys with low resistivity, typically contains very wide metal lines for power bussing and large pads for wirebonds or C4 solder balls. In the CMP process, these relatively large metal structures are sensitive to dishing because of the prolonged polishing times.

After formation of wiring according to the above-described processes, further processing may be carried out on the substrate. For example, conductive elements, such as solder balls may be attached to portions of the wiring. One example of conductive elements that may be attached include solder balls for a C4 process.

Typically, patterns for a C4 process are created utilizing standard lithography techniques. According to such processes, a seed layer may be patterned, followed by lead-tin plating.

SUMMARY OF INVENTION

Broadly, an object of the present invention is to provide a process for selectively plating metal utilizing more than one metal as an electrode. One of the metals serves as a seed layer for plating and may be patterned. Another metal may act as a current carrying conductor during plating.

According to a particular application, an object of the present invention is to provide a process that permits attaching C4 solder balls directly to a final metal level in and/or on a substrate without requiring the utilization of a mask typical of traditional processes.

An advantage of the present invention is that it provides a less expensive process that known process for producing similar results.

Another advantage of the present invention is that it may utilize a barrier metal to carry plating current.

A further advantage of the present invention is that it may eliminate plating of metal on pins.

An additional advantage of the present invention is that is may provide higher productivity as compared to known processes.

In accordance with these and other objects and advantages, the present invention provides a method for plating a second metal directly to a first without utilizing a mask. A semiconductor substrate is provided including at least one metal feature of a first metal and at least one insulating layer covering said metal feature and the substrate. At least one recess is formed in the at least one insulating layer, thereby exposing at least a portion of the metal feature. At least one conductive barrier layer is formed over the insulating layer and the exposed portion of the metal feature. A plating seed layer is formed over the at least one barrier layer. A photoresist layer is deposited over the plating seed layer. Portions of the photoresist layer and portions of the plating seed layer outside of the at least one recess are removed. Photoresist remaining in the at least one recess is removed. A second metal is plated to the plating seed layer in the recess.

Aspects of the present invention also provide a method for plating a second metal directly to a first metal without utilizing a mask. A semiconductor substrate is provided including at least one metal feature of a first metal and at least one insulating layer covering the metal feature and the substrate. At least one recess is formed in the at least one insulating layer, thereby exposing at least a portion of the metal feature. At least one conductive barrier layer is formed over the insulating layer and the exposed portion of the metal feature. A plating seed layer is formed over the at least one barrier layer. A pad is provided in the at least one recess for preventing removal of portions of the seed layer in the at least one recess. Portions of the photoresist layer and portions of the plating seed layer outside of the at least one recess are removed. The pad is removed. A second metal is electroplated to the plating seed layer in the recess.

Furthermore, aspects of the present invention provide a semiconductor structure including a semiconductor substrate. At least one metal feature of a first metal is provided in the substrate. At least one insulating layer at least partially covers the at least one metal feature. At least one recess is located in the at least one insulating layer over the at least one metal feature. At least one conductive barrier layer is located over the at least one electrical insulating layer and over a portion of the at least one metal feature under the at least one recess. At least one plating seed layer is located over a portion of the conductive barrier layer within the recess. A second metal is electroplated to the seed layer in the recesses.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

SUMMARY OF THE DRAWINGS

The above objects and advantages of the present invention will be more clearly understood when considered in conjunction with the accompanying drawings, in which.

BEST AND VARIOUS MODES FOR CARRYING OUT THE INVENTION

Figure 1:
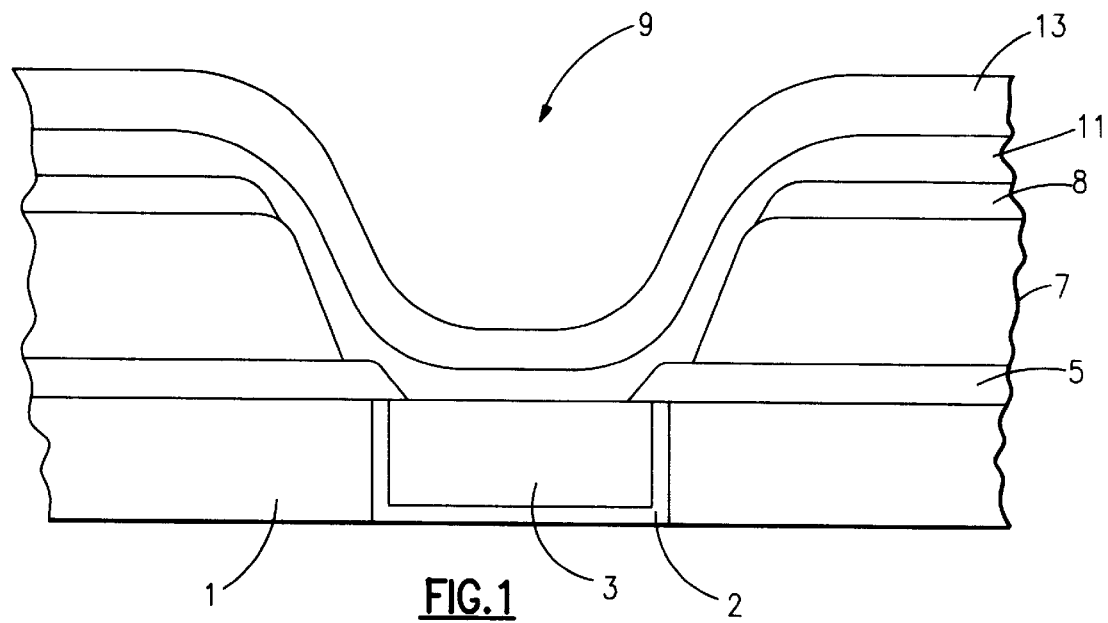
FIG. 1 represents a cross-sectional view of an embodiment of the present invention with a C4 opening etched over last metal.

As described above, the present invention relates to electroplating a second metal on a metal feature of a first metal wherein the metal feature is arranged in and/or on a substrate. The present invention permits the second metal to be electroplated without utilizing a mask.

To carry out this process, methods of the present invention utilize a highly conducting barrier film alpha-Ta to carry current and selectively plate recesses in semiconducting and non-semiconducting substrates. The methods according to the present invention include providing a substrate. Various features may be provide in the substrate for accomplishing various tasks.

For example, the various features made of conductive material may be provided in and/or on the substrate. One example of such a feature is a metal last formed in the substrate. According to one example, the last is made of copper. However, as stated above, other features may be provided in the substrate having other forms and functions and made of other conductive materials.

Often, it is desired to attach devices, such as semiconductor chips, to a substrate, such as a chip carrier. A number of processes are available for attaching devices to a substrate. Many such processes may include providing electrical connections between a device and a substrate as well as attaching the device to the substrate.

An example of a device attachment method is the C4 process. This process is described in detail in U.S. Pat. No. 5,089,440 issued Feb. 18, 1992, to Christie et al., the entire disclosure of which is hereby incorporated by reference. Such methods are also described in U.S. Pat. Nos. 3,401,126 and 3,429,040 to Miller, the entire disclosure of which is hereby incorporated by reference. The present invention is particularly useful in such processes. However, usefulness of the present invention is by no means limited to such processes. In fact, the present invention may be useful in any application for selectively plating one metal to another metal utilizing more than one metal as an electrode.

According to the present invention, a conductive barrier film of $\alpha$-Ta, TaN/$\alpha$-Ta, $\alpha$-Ta/TaN, or TaN/$\alpha$-Ta/TaN with resistivity in the range of 14 to 50 micro-ohm cm is sputtered at least in at least one recess over a metal feature in a substrate. This is followed by the deposition of a plating base or seed layer over the barrier layer. A photoresist is deposited and patterned over the plating seed layer. The photoresist and seed layer are removed on all the field regions above the at least one recess, exposing the barrier layer. The photoresist remaining in the at least one recess is removed exposing the seed layer in the at least one recess. The substrate may then be electroplated, using the workpiece as the cathode. Accordingly, plating occurs on the seed layer in the at least one recess and not on other parts of the semiconductor substrate.

According to an alternate embodiment of the present invention, a barrier film of $\alpha$-Ta, TaN/$\alpha$-Ta, $\alpha$-Ta/TaN, or TaN/$\alpha$-Ta/TaN may be sputtered at least over the at least one recess in the substrate. A plating base or seed layer is deposited. The seed layer may then be polished off outside the at least one recess. The at least one recess may then be plated using the barrier film without seed layers at the periphery of the substrate wafers for electrical contact.

Further aspects of the present invention are concerned with semiconductor substrates that includes at least one semiconductor or circuit structure located on at least one of major surface.

In accordance with the present invention, as shown in FIG. 1, a substrate 1 may be provided. Typical semiconductor substrates include silicon and group III-V semiconductors.

At least one feature made of a conducting material may be provided in and/or on the substrate. The substrate shown in FIG. 1 includes a last 3 formed in the substrate. The last in the substrate shown in FIG. 1 is copper. The last is surrounded by a layer 2 of an insulating material.

The substrate and the conductive feature may be covered by at least one layer of an electrically insulating material.

The insulating layer be thermally grown or deposited such as by chemical vapor deposition or physical vapor deposition. Typically, the insulating layer is about 2000 to about 30,000 Å thick, and more typically about 4000 to about 20,000 Å thick.

In the embodiment shown in FIG. 1, the substrate and the conductive feature are covered by an insulating layer made up of an oxide/nitride layer 5. In the embodiment shown in FIG. 1, a layer of polyimide 7 is deposited on the oxide/nitride layer 5. A polyimide passivation 8 layer made of, for example, a nitride and/or another hard insulator, may be deposited over the polyimide. The passivation layer may help to prevent the polyimide layer from picking up moisture and/or scratches, for example.

In the particular application of the present invention shown in FIG. 1, at least one recess 9 may be formed through the at least one insulating layer. The at least one recess is formed to as to expose at least a portion of the at least one conductive feature. Each conductive feature may have at least one recess formed exposing the conductive feature. More than one recess may be formed over some conductive features.

In the embodiment shown in FIG. 1, the recess 9 exposes a portion of the last metal 3. The recess may be formed according to known photolithography techniques. The recess may be formed during the deposition of the at least one insulating layer. Alternatively, the at least one recess may be formed in the at least one insulating layer after formation of the at least one insulating layer.

Next, a conductive barrier 11 may provided over the insulating layer. Preferably, the conductive barrier may include a layer of tantalum nitride first sputter deposited over the insulating layer, the walls of the recess, and the exposed conductive feature to a thickness of about 15 Å to about 500 Å and more typically to a thickness of about 50 Å to about 300 Å to act as adhesion promoting layer between the insulating layer and subsequently to be applied tantalum layer. Then, a tantalum layer may be sputtered over the layer of tantalum nitride, where it may form α-Ta spontaneously. Typically, the thickness of the tantalum layer is about 500 Å to about 3000 Å and more typically about 1000 Å to about 2000 Å. Also, α-Ta may be deposited directly over the insulator by sputtering methods. Typically, the thickness of the α-Ta is about 500 Å to about 5000 Å, and more typically about 1000 Å to about 3000 Å.

After the deposition of the barrier layer, a seed layer 13 may be deposited over the barrier layer 11 including on the walls and bottom of the recess(es). The preferred seed layer is copper, which can be deposited by sputtering or evaporation and preferably by sputtering. The copper may be sputtered employing temperatures of less than about 150° C., preferably less than about 100° C., such as about 100° C. to about −10° C. The sputtering may be carried out in the absence of an anneal. The sputtering is typically carried out to provide a seed layer of about 100 Å to about 2000 Å and preferably about 400 Å to about 1000 Å. Also, the copper seed layer may be deposited by CVD methods or by electroless plating method.

After formation of the seed layer, a photoresist may deposited over the seed layer. Any of the well known photosensitive resist materials known in the art can be employed. The resist is typically applied by spinning on or by spraying. The photoresist employed can be a positive photoresist or a negative photoresist. A positive photoresist material is one which on exposure to imaging radiation, is capable of being rendered soluble in a solvent in which the unexposed resist is not soluble. A negative resist material is one which is capable of polymerizing and/or insolubilizing upon exposure to imaging radiation.

An example of a type of photoresist material is based upon phenolic-formaldehyde Novolak polymers. A particular example of such is Shipley AZ-1350 which is a m-cresol formaldehyde novolak polymer composition. Such is a positive resist composition and includes therein a diazo ketone such as 2-diazo-1-naphthol-5-sulfonic acid ester.

The photoresist may be selectively removed everywhere except for the in the recess(es). The resist remaining in the recess(es) may protects the seed layer in the recesses (both the side walls and bottom of the recesses). The seed layer lying outside of the recesses may be removed simultaneously with the photoresist. Actually, since the seed layer lies under the photoresist, the seed layer may be removed subsequent to the removal of the photoresist. They may be removed by the same process.

Both the photoresist and the seed layer may be removed by a process such as chemical-mechanical polishing. The chemical-mechanical polishing may employ, for example, an aqueous polishing slurry containing abrasive particles such as colloidal silica.

Figure 2:
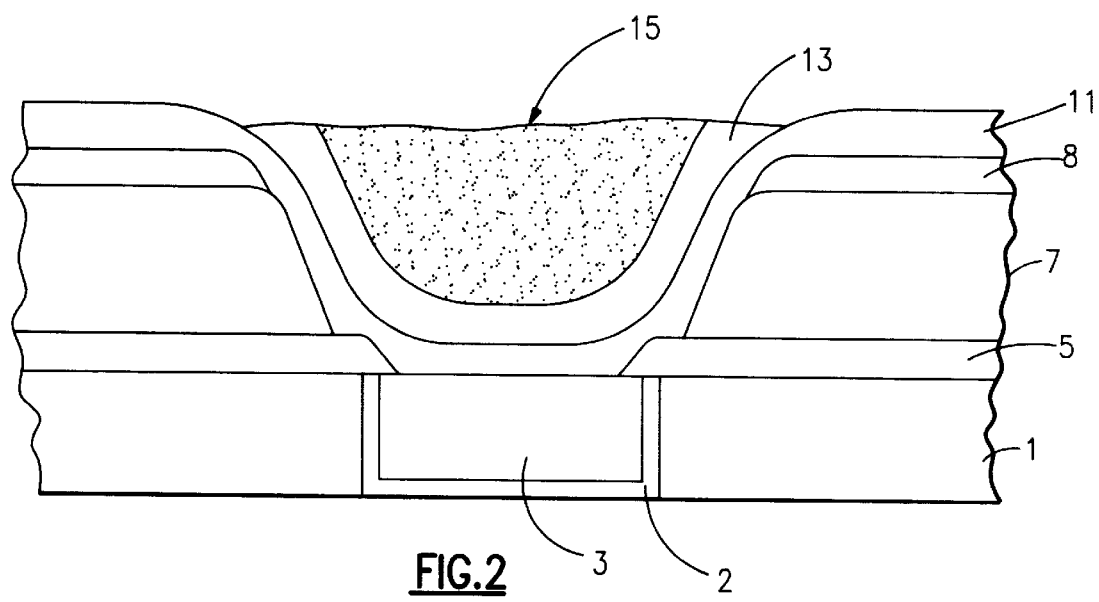
FIG. 2 represents a cross-sectional view of an embodiment of the present invention illustrating a copper seedlayer after touch-up polishing to remove resist and copper seedlayer outside a depression, while leaving resist in the depression.

Next, the portions 15 of the resist layer shown in FIG. 2 and remaining in the recess(es) that protected the seed layer within the recesses from removal is removed. The resist may be removed by dissolving in a suitable solvent for the photoresist material.

According to an alternative embodiment, photoresist may not be utilized. Such an embodiment may utilize a very hard pad to prevent dishing of the seed layer in the depression. A hard polishing pad, such as IC 1000 or IC 100/Suba IV from Rodel Inc., may be used to polish off the seed layer. One possible disadvantage of not using photoresist is that slurry utilized in chemical-mechanical polishing techniques may enter the recess. The slurry typically would then need to be removed. One way to remove the slurry is in a megasonic cleaning solution.

Figure 3:
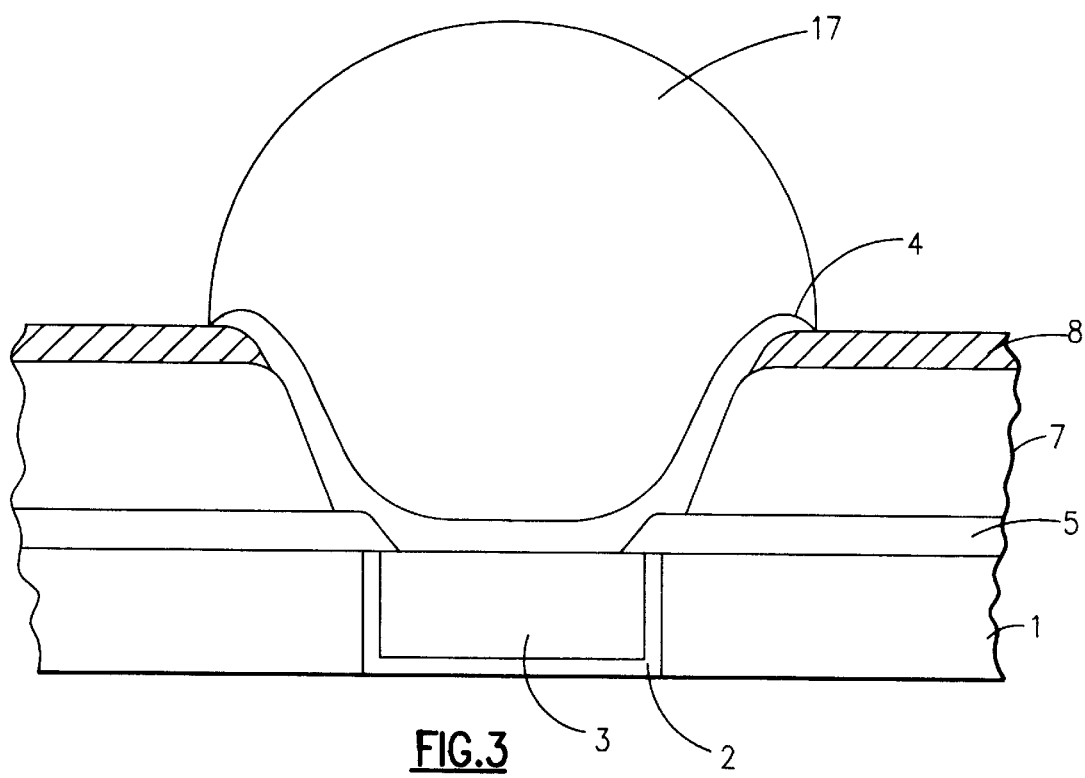
FIG. 3 represents a cross-sectional view of an embodiment of the present invention illustrating a state in a process according to the present invention in which resist has been stripped, solder plated and reflowed, a barrier removed, copper seed layer consumed by solder reflow and a C4 ball arranged in a recess and joined to the structure.

After removal of the resist, if necessary, conductive metal 17, such as lead-tin or other terminal metallurgies, is electroplated on the portions of the seed layer remaining in the recesses, to result in the structure shown in FIG. 3. During the electroplating, the barrier layer 11 may act as a cathode terminal for carrying the electroplating current. For lead-tin solders, plating, commercial solder plating baths such as NF 800 HS or NF 72 BC from Technic Inc., Rhode Island, may be used. Other proprietary commercially available lead-tin solders, eutectic solders, lead-free solders and/or other platable terminal metallurgies may be utilized.

The electroplating is continued a desired amount of the conductive metal is plated in the recess(es). This usually takes about 10 min. to about 90 min, more typically about 20 min. to about 75 min. The thickness of the electroplated metal or alloy is typically about $25\mu$ to about $200\mu$, and more typically about $40\mu$ to about $75\mu$.

In the case of exposed α-Ta, the metal being plated will not plate on the barrier layer due to the formation of a very thin oxide layer when contacting the electroplating bath. The oxide layer may be described as a "superficial" layer. This oxide layer will form naturally if the barrier layer is a tantalum layer such as that described above. In another embodiment, the oxide layer may be formed by momentarily reversing the polarity of the field, rendering the workpiece anodic, prior to the electroplating. The polarity change may be brief, such as about 10 seconds. Formation of the oxide layer may also be described as "anodization". The current density should be such that at the end of the current reversal, sufficient copper is left in the recesses for plating to initiate.

Next, the barrier layer 11 may be removed down to the polyimide or polyimide passivation layer, after the solder reflow. The barrier layer may be removed by utilizing the electroplated metal as a mask.

According to the process of the present invention, no lithograph step is required to define the seed layer since the chemical-mechanical polishing step makes the seed layer self-aligning to the recess(es). Not requiring a lithographic step simplifies the process. Additionally, the process may be less costly as compared to typical lithographically defined C4 processes. This simplification and cost advantage may be realized in any process requiring similar selective plating of metal(s).

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A semiconductor structure, comprising:

a semiconductor substrate;

at least one metal feature provided in said substrate;

at least one insulating layer at least partially covering said at least one metal feature;

at least one recess located in said at least one insulating layer over said at least one metal feature;

at least one conductive barrier layer located over said at least one electrical insulating layer and over a portion of said at least one metal feature under said at least one recess, said conductive barrier layer comprising at least one nitride of tantalum and α-phase tantalum;

at least one plating seed layer of a first metal located over a portion of said conductive barrier layer within said at least one recess, said seed layer and barrier layer in combination forming a continuous conductive layer; and a second metal electroplated to said seed layer within said at least one recess.

2. The semiconductor structure according to claim 1, wherein said at least one metal feature is formed of at least one metal or alloy having low resistivity.

3. The semiconductor structure according to claim 2, wherein said metal or alloy includes at least one member selected from the group consisting of Al, Au, Ni, W, α-Ta, and alloys including Al, Au, Ni, W, or α-Ta.

4. The semiconductor structure according to claim 1, wherein the barrier layer further comprises a layer of tantalum on the tantalum nitride layer.

5. The semiconductor structure according to claim 4, wherein the tantalum nitride layer is about 10 Å to about 1000 Å thick and the tantalum layer is about 500 Å to about 5000 Å thick.

6. The semiconductor structure according to claim 4, wherein the barrier layer comprises a TaN/α-Ta/TaN-laminate.

7. The semiconductor structure according to claim 1, wherein the seed layer comprises copper.

8. The semiconductor structure according to claim 7, wherein the barrier layer comprises tantalum and barrier and seed layers comprise α-Ta/TaN/Cu.

9. The semiconductor structure according to claim 7, wherein said copper layer is about 1000 Å to about 20,000 Å thick.

10. The semiconductor structure according to claim 1, wherein the barrier layer forms a conductor for electroplating of the second metal.

11. The semiconductor structure according to claim 1, wherein the second metal comprises a solder ball comprising an alloy of lead and tin, plated lead-free solder or other platable terminal metallurgies.

12. The semiconductor structure according to claim 1, wherein the second metal is a solder ball.

13. The semiconductor structure according to claim 1, wherein said the layer comprises a layer of an oxide and a nitride and at least one layer of a polyimide.

14. The semiconductor structure according to claim 13, further comprising:

a layer of at least one nitride or other passivation layer over the polyimide.

* * * * *

UNITED STATES PATENT AND TRADEMARK OFFICE
CERTIFICATE OF CORRECTION

PATENT NO. : 6,251,528 B1
DATED : June 26, 2001
INVENTOR(S) : Cyprian E. Uzoh et al.

It is certified that error appears in the above-identified patent and that said Letters Patent is hereby corrected as shown below:

Title page,
ABSTRACT, last line, after "recess" insert -- using the barrier to conduct electrical current --.

Column 2,
Line 36, change "that know process" to -- than known processes --.
Line 43, change "is" (second occurrence) to -- it --.

Column 4,
Line 32, delete "at least" (first occurrence).

Column 5,
Line 31, after "may" insert -- be --.
Line 60, after "may" insert -- be --.

Column 6,
Line 51, after "continued" insert -- and --.

Signed and Sealed this

Ninth Day of April, 2002

Attest:

*Attesting Officer*

JAMES E. ROGAN
*Director of the United States Patent and Trademark Office*